United States Patent [19]
Krumm et al.

[11] 4,313,126
[45] Jan. 26, 1982

[54] FIELD EFFECT TRANSISTOR

[75] Inventors: Charles F. Krumm, Thousand Oaks, Calif.; Robert A. Pucel, Needham, Mass.

[73] Assignee: Raytheon Company, Lexington, Mass.

[21] Appl. No.: 41,156

[22] Filed: May 21, 1979

[51] Int. Cl.³ .............................................. H01L 29/80
[52] U.S. Cl. ........................................ 357/22; 357/15; 357/23; 357/36; 357/41; 357/55; 357/61
[58] Field of Search .................... 357/22, 23, 36, 15, 357/55, 61, 41

[56] References Cited
U.S. PATENT DOCUMENTS

| | | | |
|---|---|---|---|
| 3,803,461 | 4/1974 | Beneking | 357/23 |
| 3,829,883 | 8/1974 | Bate | 357/23 |
| 4,141,023 | 2/1979 | Yamada | 357/41 |

*Primary Examiner*—Edward J. Wojciechowicz
*Attorney, Agent, or Firm*—Richard M. Sharkansky; Joseph D. Pannone

[57] ABSTRACT

A field effect transistor is provided wherein a semiconductor body has a source region and a plurality of drain regions with a gate region common to the plurality of drain regions. A common gate electrode is formed over the common gate region to control the flow of carriers to each one of the plurality of drain regions. With such arrangement an efficient multi-drain field effect transistor is provided through the use of a common gate electrode formed on the semiconductor body.

2 Claims, 8 Drawing Figures

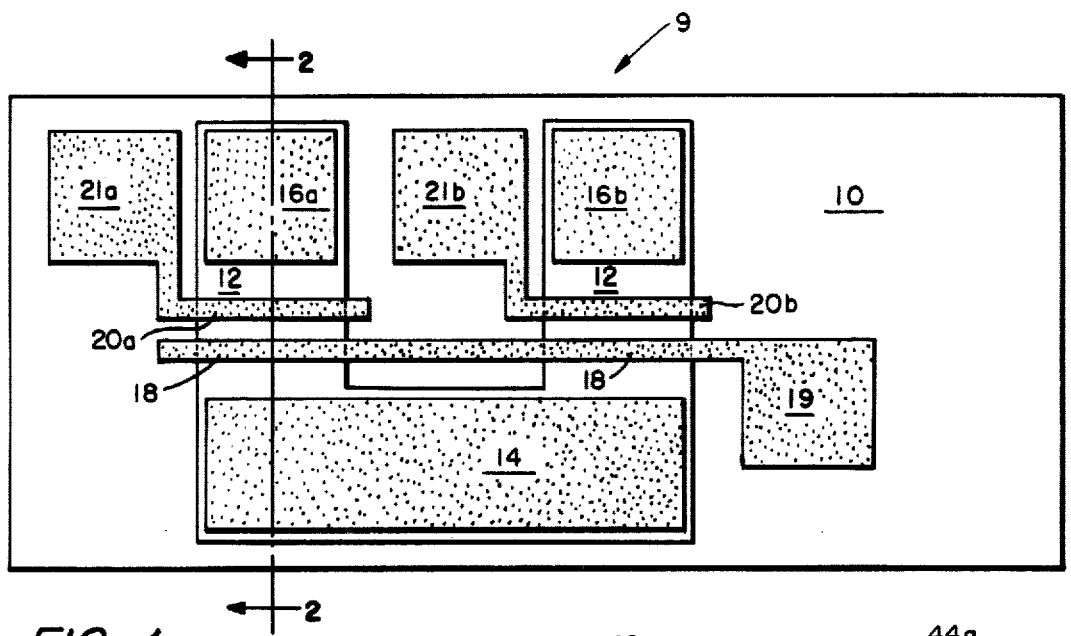
FIG. 1
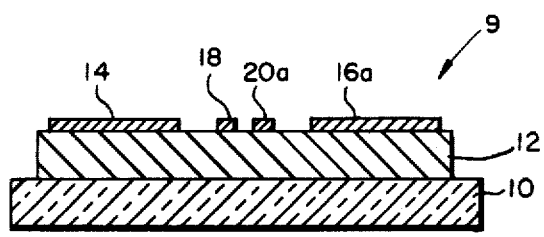
FIG. 2
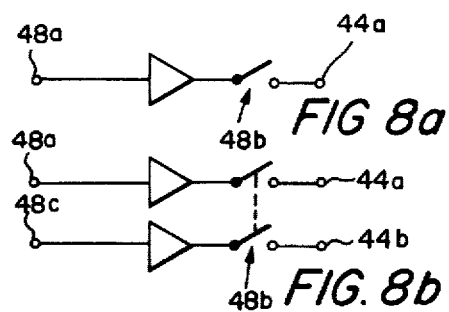
FIG. 8a
FIG. 8b
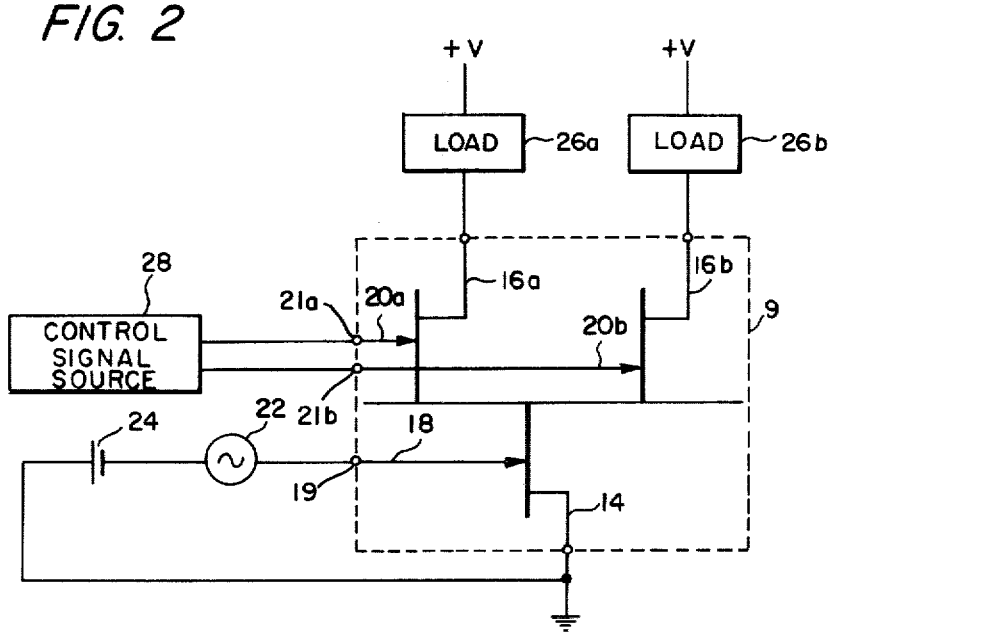
FIG. 3

4,313,126

FIELD EFFECT TRANSISTOR

BACKGROUND OF THE INVENTION

This invention relates generally to microwave switching devices and more particularly to semiconductor microwave switching devices.

As is known in the art, one type of semiconductor microwave switching device is a p-i-n diode; however, such device is generally limited in switching time to greater than one nsec and has an insertion loss which increases with frequency from approximately 0.5 db at 10 GHZ to around 1 db at 18 GHZ.

Another type of switching device is a field effect transistor (FET). Such devices have substantial advantage over p-i-n devices because, inter alia, the FET can amplify an input signal. One type of FET includes a pair of gate electrodes positioned between source and drain electrodes. In some applications, as where a microwave signal is to be switched to one of a plurality of loads selectively in accordance with a switching signal, a corresponding plurality of these dual gate FET's would generally have to be electrically interconnected with electrical conductors. At microwave frequencies these conductors produce parasitic inductances and/or capacitances which affect the electrical characteristics of the device and reduce the efficiency of the overall circuit.

SUMMARY OF THE INVENTION

In accordance with the present invention a field effect transistor is provided wherein a semiconductor body has a source region and a plurality of drain regions with a gate region common to the plurality of drain regions. A common gate electrode is formed over the common gate region to control the flow of carriers to each one of the plurality of drain regions. With such arrangement an efficient multidrain field effect transistor is provided through the use of a common gate electrode formed on the semiconductor body.

In a preferred embodiment of the invention a common source region is provided for each one of the plurality of drain regions, the common gate electrode controlling the flow of carriers from the common source region to the plurality of separate drain regions. A plurality of separate gate electrodes are formed over the surface of the semiconductor body, each one being associated with a corresponding one of the separate drain regions.

BRIEF DESCRIPTION OF THE DRAWINGS

The foregoing features of this invention, as well as the invention itself, may be more fully understood from the following detailed description read together with the accompanying drawings in which:

FIG. 1 is a plan view of a multi-gate field effect transistor according to the invention;

FIG. 2 is a cross-section elevation view of the multi-gate field effect transistor shown in FIG. 1, such cross-section being taken along line 2—2 in FIG. 1;

FIG. 3 is a schematic diagram of the multi-gate field effect transistor of FIG. 1 fed by a microwave signal which is coupled to one or more of a pair of loads selectively in accordance with control signals;

FIGS. 8a-8b are schematic diagrams representative of the switching configurations in which the field effect transistor shown in FIG. 4 may be operated.

DESCRIPTION OF THE PREFERRED EMBODIMENT

Figure 4:
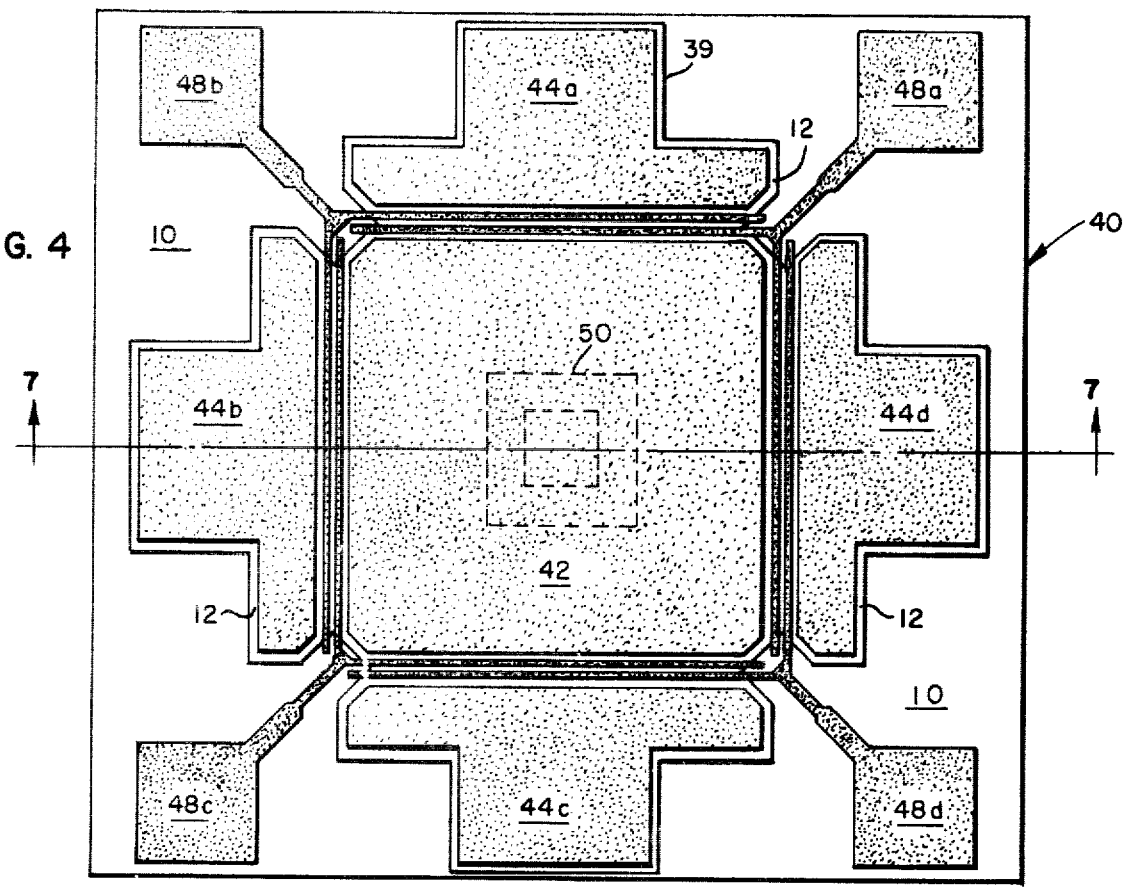
FIGS. 4, 5, and 6 are plan views of a multi-gate field effect transistor according to the invention wherein a common source electrode is surrounded about its periphery by a plurality of separate drain electrodes.

Referring now to FIGS. 1 and 2, a multi-gate field effect transistor, here a dual-gate field effect transistor 9, is shown to include a semi-insulating substrate 10, here gallium arsenide, having an epitaxially grown n-type conductivity semiconductor layer 12 of gallium arsenide formed thereon using any well-known process. A common source electrode 14 is formed in ohmic contact with the semiconductor layer 12 in any well-known manner. A plurality of, here two, separate drain electrodes 16a, 16b is also formed in ohmic contact with the semiconductor layer 12, as shown. A common gate electrode 18 has portions formed in rectifying or Schottky barrier contact with the semiconductor layer 12 in any well-known manner and a contact region 19 disposed on the semi-insulating substrate 10, as shown. The portions of the common gate electrode 18 disposed on the semiconductor layer 12 are disposed between the common source electrode 14 and the pair of separate drain electrodes 16a, 16b. Second gate electrodes 20a, 20b are formed in rectifying or Schottky barrier contact with the semiconductor layer 12, such gate electrodes 20a, 20b having contact regions 21a, 21b, respectively, on the semi-insulating substrate 10, as shown. The second gate electrodes 20a, 20b are disposed between the common source electrode 14 and corresponding drain electrodes 16a, 16b, as shown. With such arrangement, a field effect transistor is provided wherein a common source region is disposed beneath the common source electrode 14 and a plurality of, here two, separate drain regions are disposed beneath independent drain electrodes 16a, 16b.

Referring now to FIG. 3, the dual-gate field effect transistor 9 is shown having the common gate electrode 18 serially coupled to a suitable microwave signal source 22 and a suitable voltage supply 24 to the source electrode 14 as shown. The voltage supply 24 provides a reverse bias on the transistor, thereby producing a depletion zone beneath the gate electrode 14. The depth of the depletion zone (ie. the zone beneath the common gate electrode 18) increases as the voltage on the gate electrode 18 increases in a negative sense and decreases as the voltage to the gate electrode 18 increases in a positive sense. Therefore, the microwave signal produced by microwave signal source 22 modulates the depth of the depletion zone.

The drain electrodes 16a, 16b are coupled to suitable loads 26a, 26b, respectively, as shown, and to a +V voltage source, as shown. The gate electrodes 20a, 20b are connected, via contact regions 21a, 21b, respectively, to a control signal source 28, here of any conventional design, which produces control signals for the gate electrodes 20a, 20b. Such control signals are here logic signals such that when either one of such signals represents a logical 1 state electrons are able to flow between the source and drain regions and beneath the gate electrode fed by such logical signal, and when such logical signal represents a logical 0 state electrons are inhibited from flowing between the source and drain regions and beneath the gate electrode fed by such logical 0 signal. Therefore, considering, for example, the condition when a logical 1 signal is fed to gate electrode 20a, modulation produced in the depth of the depletion zone beneath gate electrode 18 caused by the microwave signal correspondingly modulates the source-drain current flowing from the +V supply, through load 26a, to the grounded source electrode 14 (because the cross-sectional area beneath the depletion zone presented to the electron flow is correspondingly modulated). When the logical signal fed through gate electrode 20a represents a logical 0, sufficient negative voltage is produced at gate electrode 20a to increase the depth of the depletion zone formed beneath such gate electrode 20a such that current is inhibited from flowing to load 26a. Similarly, when the logical signal fed to gate 20b represents a logical 1 a modulating current representative of the microwave signal is produced through load 26b and conversely when the logical signal fed to gate electrode 20b represents a logical 0 a modulating signal corresponding to the microwave signal is inhibited from being produced in load 26b. It is noted that if the control signal source 28 produces logical 0 signals for both gate electrodes 20a, 20b a microwave signal is inhibited from passing to either loads 26a or 26b, and, conversely, if the logical signals fed to both gate electrodes 20a, 20b represent logical 1 states a microwave signal is developed in both loads 26a, 26b. In summary then, the microwave signal produced by source 22 may be coupled either to: load 26a, load 26b; both loads 26a and 26b; or may be inhibited from being coupled to both such loads 26a, 26b selectively in accordance with the control signals produced by control signal source 28.

Figure 7:
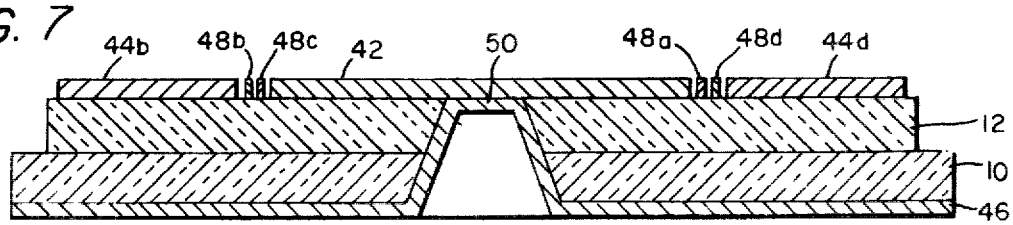
FIG. 7 is a cross-section view of the field effect transistor shown in FIG. 4, such cross-section being taken along line 7—7.

Referring now to FIG. 4, a multi-gate field effect transistor 40 is shown having a common source electrode 42, such electrode being in ohmic contact with semiconductor layer 12, the periphery of such layer 12 being indicated by the line 39. Disposed about the periphery of such common source electrode 42 is a plurality of, here four, drain electrodes 44a, 44b, 44c, 44d, as shown, each being in ohmic contact with the semiconductor layer 12. (Referring briefly to FIG. 7, common source electrode 42 is here coupled to a conductor 46 disposed on the surface of semi-insulating substrate 10 through a conductor 50 plated through a via formed through the semi-insulating substrate 10 and semiconductor layer 12, as shown.) Referring again to FIG. 4, a plurality of, here four, gate electrodes 48a, 48b, 48c, 48d have portions thereof formed in rectifying or Schottky barrier contact with semiconductor layer 12 and contact pads disposed on the semi-insulating substrate 10, as shown. The portion of the gate electrode 48a disposed on the semiconductor layer 12 is disposed between the common source electrode 42 and drain electrodes 44a and 44d. The portion of the gate electrode 48b disposed on the semiconductor layer 12 is disposed between common source electrode 42 and drain electrodes 44a, 44b. The portion of the gate electrode 48c disposed on the semiconductor layer 12 is disposed between common source electrode 42 and drain electrodes 44b and 44c. Finally, the portion of the gate electrode 48d disposed on the semiconductor layer 12 is disposed between common source electrode 42 and drain electrodes 44c and 44d. It should be noted that gate electrode 48a provides a common gate electrode between common source electrode 42 and drain electrodes 44a, 44d; gate electrode 48b serving as an individual electrode between source electrode 42, and drain electrode 44a and gate electrode 48d serving as an individual gate electrode between common source electrode 42 and drain electrode 44d. Therefore, as between common source electrode 42 and drain electrodes 44a and 44d gate electrode 48a provides a common electrode to which a suitable microwave signal may be fed and control signals may be fed to gate electrodes 48b, 48d to couple such microwave signal to drain electrodes 44a, 44d selectively in accordance with such control signals as discussed in connection with FIG. 3. Alternatively, a microwave signal may be fed to gate electrode 48b and control signals fed to gate electrodes 48a, 48c may be used to couple such microwave signal to drain electrodes 44a, 44b, selectively in accordance with such control signals. A little thought will make it apparent that the configuration shown for the field effect transistor 40 enables such transistor 40 to be operated in a number of possible switching configurations. For example, using any one of the drain electrodes 44a–44d as the outputs and the two gate electrodes adjacent such one of the drain electrodes as inputs, a single pole/single throw switch is provided as shown in FIG. 8a. As another example, separate, independent microwave signals may be fed to gate electrodes 48a, 48c, respectively, and such signals may be selectively coupled or decoupled from drain electrodes 44a, 44b, respectively, in accordance with a control signal fed to gate electrode 48b to form a double pole/single throw switch as shown in FIG. 8b.

Figure 5:
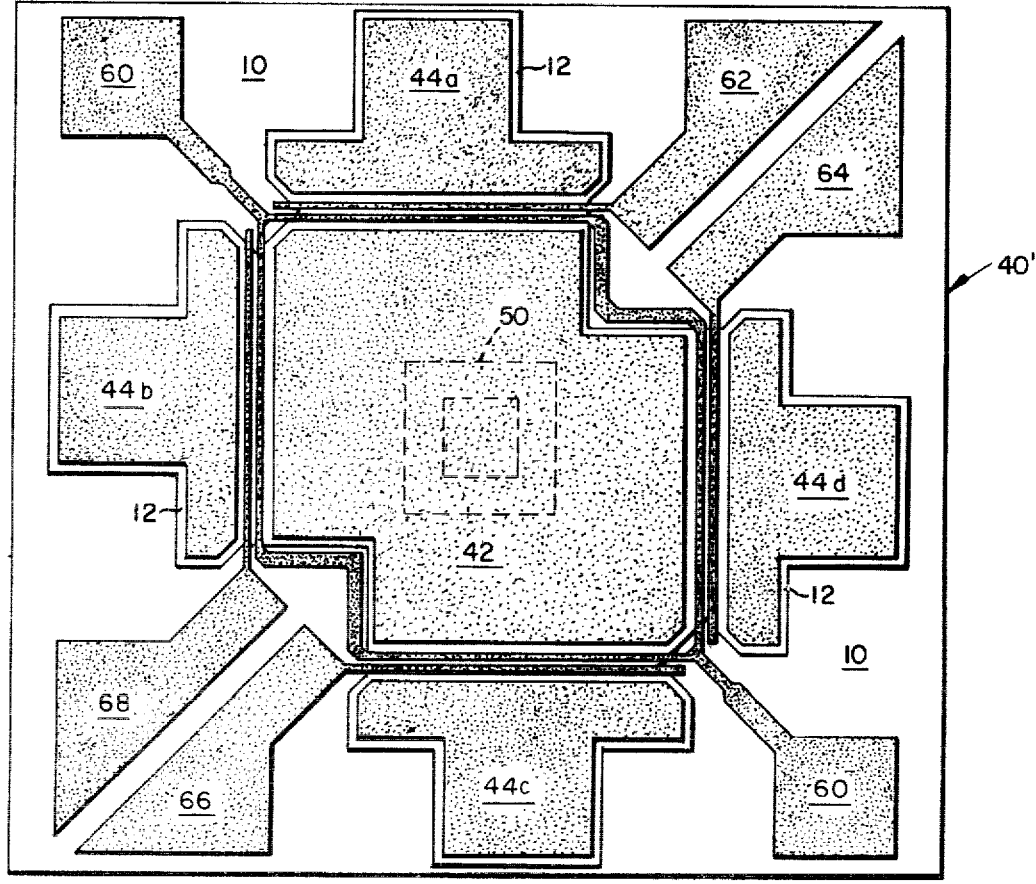

Referring now to FIG. 5, an alternative embodiment of the invention is shown. Here a multi-gate field effect transistor 40' includes a gate electrode 60 having portions thereof on the semiconductor layer 12 which are disposed between source electrode 42 and all four drain electrodes 44a–44d, as shown. The contact pads of gate electrode 60 are disposed on the semi-insulating substrate 10. Four separate gate electrodes 62, 64, 66, 68 have regions disposed on the semiconductor layer 12 dis-disposed between the gate electrode 60 and the four drain electrodes 44a, 44d, 44c and 44b, respectively, as shown and contact pads disposed on the substrate 10, as shown. With such arrangement a microwave signal fed to the gate electrode 60 may be selectively coupled to each or all four drain electrodes 44a, 44b, 44c, 44d (formed in ohmic contact with the semiconductor layer 14) in accordance with the control signals fed to gate electrodes 62, 68, 66, and 64, respectively.

Figure 6:
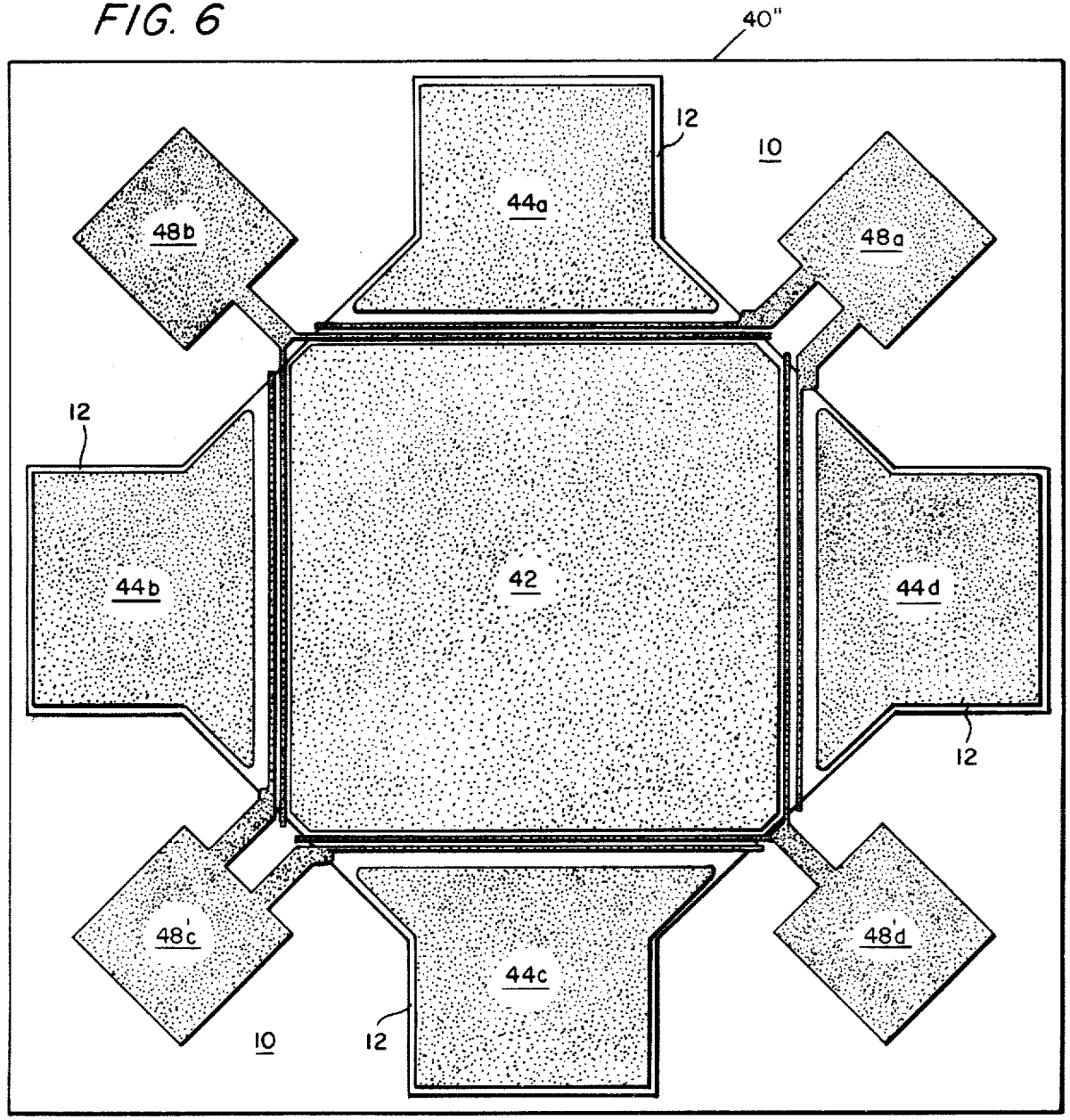

FIG. 6 shows still another embodiment of the invention. Here a multi-gate field effect transistor 40'' has a common source electrode 42 and four separate drain electrodes 44a, 44b, 44c and 44d, the gate electrodes 48a' and 48c' being formed, as shown.

Having described preferred embodiments of the invention, it will now become readily apparent to those of skill in the art that other embodiments incorporating these concepts may be used. For example, while logical signals have been described as the control signals for the transistor, analog signals or multi-level signals may be used for applications such as amplifiers, mixers, modulators, multipliers or variable gain amplifiers. It is felt, therefore, that this invention should not be restricted to the disclosed embodiments, but rather should be limited only by the spirit and scope of the appended claims.

What is claimed is:

1. A field effect transistor, comprising:
  (a) a semiconductor;

(b) a source electrode means in contact with such semiconductor for providing a source region for the transistor;

(c) a plurality of separate, electrically independent drain electrode means in contact with such semiconductor for providing a plurality of separate electrically independent drain regions for the transistor;

(d) a common gate electrode means for controlling a flow of carriers in the semiconductor between the source region and the plurality of separate, electrically independent, drain regions; and (e) a plurality of separate, electrically independent, electrode means, each one being adapted to control a flow of carriers in the semiconductor between a corresponding one of the separate drain regions and the source region.

2. A semiconductor device comprising:

(a) a semiconductor;

(b) a plurality of separate, electrically independent electrode means in contact with the semiconductor for providing a plurality of separate, electrically independent first regions for the transistor;

(c) electrode means in contact with the semiconductor for providing a second region for the transistor;

(d) a common gate electrode means for controlling a flow of carriers in the semiconductor between the second region and each one of the plurality of separate first regions; and (e) a plurality of separate, electrically independent gate electrode means, each one thereof being adapted to control a flow of carriers in the semiconductor between the second region and a corresponding one of the plurality of separate first regions.

* * * * *